(12) United States Patent
Naka et al.

(10) Patent No.: US 9,859,480 B2
(45) Date of Patent: Jan. 2, 2018

(54) LIGHT EMITTING DEVICE AND METHOD OF MANUFACTURING LIGHT EMITTING DEVICE

(71) Applicant: NICHIA CORPORATION, Anan-shi (JP)

(72) Inventors: Ryoji Naka, Tokushima (JP); Atsushi Bando, Itano-gun (JP); Tomohide Miki, Tokushima (JP); Kimihiro Miyamoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/241,075

(22) Filed: Aug. 19, 2016

(65) Prior Publication Data

US 2017/0054061 A1 Feb. 23, 2017

(30) Foreign Application Priority Data

Aug. 20, 2015 (JP) ................... 2015-162842
May 9, 2016 (JP) ................... 2016-093768
Jun. 29, 2016 (JP) ................... 2016-128967

(51) Int. Cl.
*H01L 33/48* (2010.01)
*H01L 33/52* (2010.01)
(Continued)

(52) U.S. Cl.
CPC ............. *H01L 33/56* (2013.01); *H01L 33/08* (2013.01); *H01L 33/48* (2013.01); *H01L 33/486* (2013.01);
(Continued)

(58) Field of Classification Search
CPC ..... H01L 33/48; H01L 33/483; H01L 33/486; H01L 33/54; H01L 33/56
See application file for complete search history.

(56) References Cited

U.S. PATENT DOCUMENTS 7,456,500 B2 * 11/2008 Kromotis ............ H01L 25/0753
257/676
2004/0089898 A1 5/2004 Ruhnau et al.
(Continued)

FOREIGN PATENT DOCUMENTS

JP 2004-040099 2/2004
JP 2005-136378 5/2005
(Continued)

Primary Examiner — Robert Bachner
Assistant Examiner — Molly Reida
(74) Attorney, Agent, or Firm — Mori & Ward, LLP

(57) ABSTRACT

A light emitting device includes a package, at least one light emitting element, a light-transmissive resin, and a light reflecting resin. The package has a recess which includes a bottom surface and an inner peripheral surface. The bottom surface includes a light emitting element mounting region and a groove. The groove has an inner peripheral edge and an outer peripheral edge on the bottom surface to define the groove between the inner peripheral edge and the outer peripheral edge. The at least one light emitting element is mounted on the light emitting element mounting region. The light-transmissive resin is provided in the recess to cover the at least one light emitting element and to be in contact with the groove. The light reflecting resin is provided between the inner peripheral surface of the recess and the light-transmissive resin to reach the outer peripheral edge of the groove.

10 Claims, 16 Drawing Sheets

(51) Int. Cl.
  *H01L 33/56* (2010.01)
  *H01L 33/60* (2010.01)
  *H01L 33/62* (2010.01)
  *H01L 33/08* (2010.01)

(52) U.S. Cl.
  CPC .............. *H01L 33/52* (2013.01); *H01L 33/60* (2013.01); *H01L 33/62* (2013.01); *H01L 2933/005* (2013.01); *H01L 2933/0066* (2013.01)

(56) References Cited

U.S. PATENT DOCUMENTS

| | | |
|---|---|---|
| 2008/0054287 A1 | 3/2008 | Oshio et al. |
| 2009/0200570 A1* | 8/2009 | Mori .................... H01L 33/642 257/99 |
| 2014/0085884 A1 | 3/2014 | Horio et al. |

FOREIGN PATENT DOCUMENTS

| | | |
|---|---|---|
| JP | 2008-060344 | 3/2008 |
| JP | 2009-295892 | 12/2009 |
| JP | 2013-004773 | 1/2013 |
| JP | 2013-243237 | 12/2013 |
| JP | 2014-067846 | 4/2014 |
| JP | 2014-072021 | 4/2014 |
| JP | 2014-072415 | 4/2014 |
| JP | 2014-157976 | 8/2014 |
| JP | 2014-195127 | 10/2014 |
| JP | 2015-225942 | 12/2015 |

* cited by examiner

F I G. 5
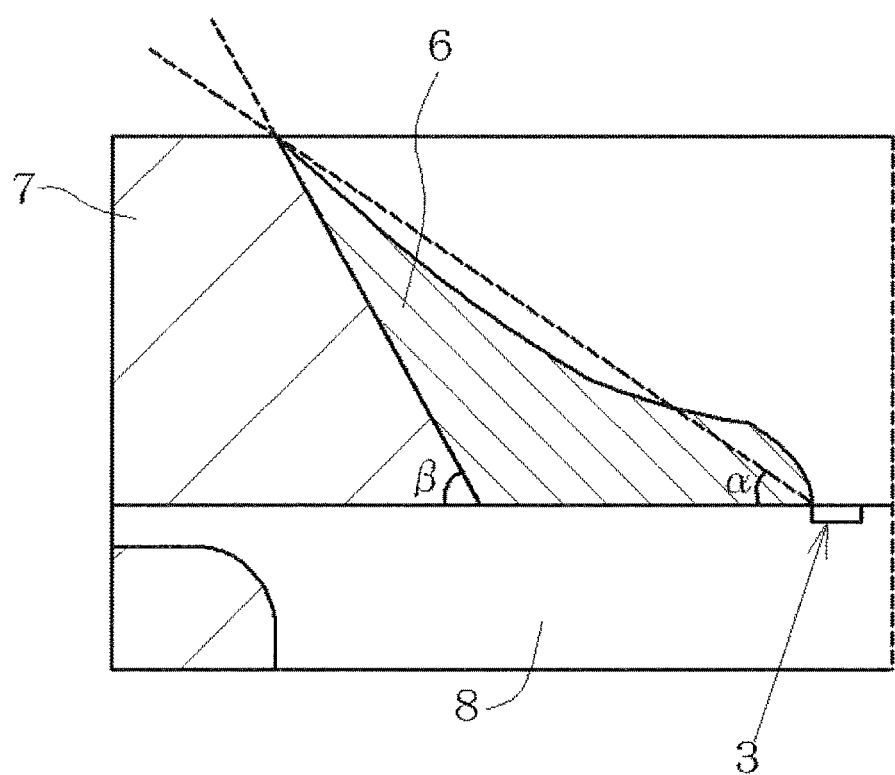

LIGHT EMITTING DEVICE AND METHOD OF MANUFACTURING LIGHT EMITTING DEVICE

CROSS-REFERENCE TO RELATED APPLICATIONS

The present application claims priority under 35 U. S. C. §119 to Japanese Patent Application No. 2015-162842, filed Aug. 20, 2015, Japanese Patent Application No. 2016-093768, filed May 9, 2016, and Japanese Patent Application No. 2016-128967, filed Jun. 29, 2016. The contents of these applications are incorporated herein by reference in their entirety.

BACKGROUND OF THE INVENTION

Technical Field

The present disclosure relates to a light emitting device and a method of manufacturing a light emitting device.

Discussion of the Background

Light emitting devices using a light emitting element such as an LED readily attain high light emission efficiency. Accordingly, they are used for various devices including backlight of a display or the like and illumination lighting. For the purpose of improving the light extraction efficiency of such a light emitting device using a light emitting element, there is known a light emitting device that includes: a light emitting element disposed in a cavity formed at a package; a light-transmissive sealing resin (a light-transmissive resin) that seals the light emitting element; and a light reflecting resin (a light reflecting resin) being higher in reflectivity than an inner surface of the cavity. JP 2008-60344 A discloses such an exemplary light emitting device.

SUMMARY OF THE INVENTION

According to a first aspect of the present invention, a light emitting device includes a package, at least one light emitting element, a light-transmissive resin, and a light reflecting resin. The package has a recess which includes a bottom surface and an inner peripheral surface around a periphery of the bottom surface. The bottom surface includes a light emitting element mounting region and a groove surrounding the light emitting element mounting region. The groove has an inner peripheral edge and an outer peripheral edge on the bottom surface to define the groove between the inner peripheral edge and the outer peripheral edge. The at least one light emitting element is mounted on the light emitting element mounting region. The light-transmissive resin is provided in the recess to cover the at least one light emitting element and to be in contact with the groove. The light reflecting resin is provided between the inner peripheral surface of the recess and the light-transmissive resin to reach the outer peripheral edge of the groove.

According to a second aspect of the present invention, a method of manufacturing a light emitting device includes providing a package. The package has a recess which includes a bottom surface and an inner peripheral surface around a periphery of the bottom surface. The bottom surface includes a light emitting element mounting region and a groove surrounding the light emitting element mounting region. A light emitting element is mounted on the light emitting element mounting region. The light emitting element and an electrode of the package are connected with a wire. A light reflecting resin is provided in the recess so as to surround the light emitting element mounting region and so as to cover at least a part of the wire. A light-transmissive resin is provided in the recess to cover the light emitting element and to be in contact with the groove.

According to a third aspect of the present invention, a light emitting device includes a package, a light emitting element, a light-transmissive resin, and a light reflecting resin. The package has a recess which includes a bottom surface and an inner peripheral surface around a periphery of the bottom surface. The bottom surface includes a bottom surface recess having a light emitting element mounting region. The bottom surface recess has a lateral surface and an upper edge connected to the lateral surface. The light emitting element is mounted on the light emitting element mounting region. The light-transmissive resin is provided in the recess to cover the light emitting element and to be in contact with the lateral surface of the bottom surface recess. The light reflecting resin provided between the inner peripheral surface of the recess and the light-transmissive resin to reach the upper edge of the bottom surface recess.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 5 is a schematic cross-sectional view showing the shape of a light reflecting resin of the light emitting device according to the first embodiment.

DESCRIPTION OF THE EMBODIMENTS

Figure 1A:
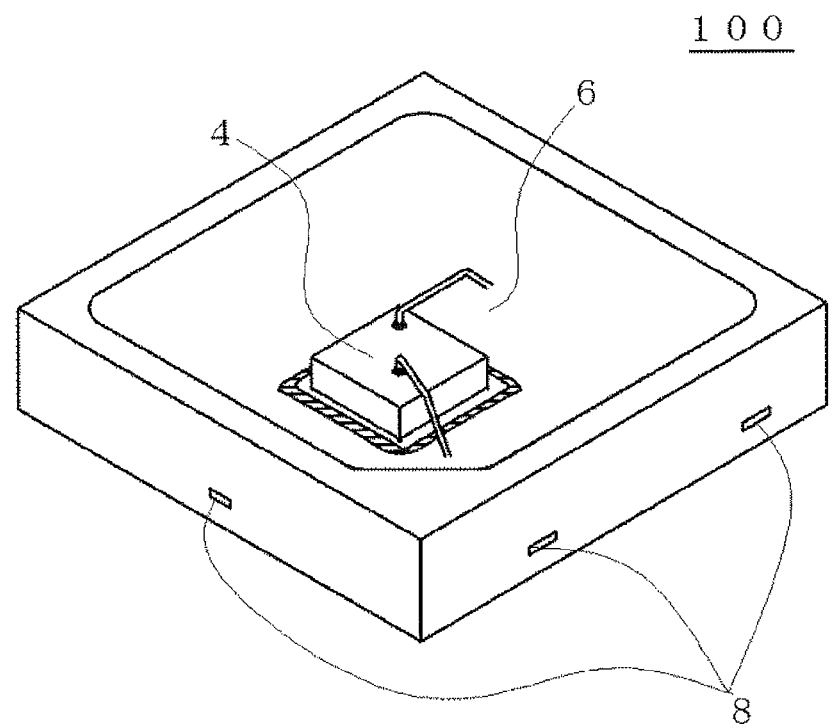
FIG. 1A is a schematic perspective view of a light emitting device according to a first embodiment.

The embodiments will now be described with reference to the accompanying drawings, wherein like reference numerals designate corresponding or identical elements throughout the various drawings.

A light emitting device of the present disclosure includes: a package having a recess including an inner peripheral surface (hereinafter referred to as "a lateral surface") and a bottom surface, and a linear or dotted groove provided at the bottom surface so as to be spaced apart from the lateral surface and to surround an element mounting region; a light emitting element mounted on the element mounting region; a light-transmissive resin that covers the light emitting element and is in contact with an inner surface of the groove; and a light reflecting resin that is formed continuously from the lateral surface of the recess to an outer upper edge of the groove.

The package of the light emitting device of the present disclosure has the recess including lateral surfaces and the bottom surface. The light emitting element is mounted on the bottom surface of the recess. The linear or dotted groove is formed to surround the region where the light emitting element is mounted (hereinafter also referred to as the "element mounting region"). The groove prevents the light reflecting resin described later from flowing to reach the lateral surfaces of the light emitting element and covering the lateral surfaces of the light emitting element.

Further, the groove is disposed to be spaced apart from the lateral surfaces of the recess and to surround near the light emitting element. As used herein, "to surround" refers to the state where the light emitting element is mounted on the inner side relative to the linear groove or on the inner side relative to an outer circumferential shape formed by connecting the segments of the dotted groove.

The package of the light emitting device of the present disclosure may be, for example, insulating material such as ceramic including a wiring or may be a resin package having a molded body in which a metal plate such as iron, copper, silver, kovar, nickel plate or the like is buried. The metal plate has at least an electrode portion (a pair of leads described later), and may additionally have any sites for releasing heat. As used herein, the "electrode portion" refers to the site that is electrically connected to the electrodes of the light emitting element.

The light emitting device of the present disclosure has the light emitting element such as a light emitting diode. The light emitting element is mounted on the element mounting region defined by the groove in the recess of the package. The light emitting element may be provided by one or two or more in number. For example, a plurality of light emitting elements may be mounted on one element mounting region defined by one groove. Alternatively, a single or a plurality of light emitting elements may be mounted on one of a plurality of element mounting regions respectively defined by a plurality of grooves.

The light-transmissive resin covers the light emitting element. The light-transmissive resin protects the light emitting element from external force, dust, moisture and the like, and improves heat resistance, weather resistance, and light-fastness of the light emitting element.

The light-transmissive resin is formed so as to be in contact with at least part of the inner surface of the groove. Thus, provided that the light reflecting resin expands by the heat from the light emitting element and invites stress for creeping up the lateral surfaces of the light emitting element, the light-transmissive resin (in particular, the light-transmissive resin positioned at the inner surface of the groove) can apply stress in the direction counter to the stress. As a result, the light reflecting resin is prevented from covering the lateral surfaces of the light emitting element, which would otherwise result in light failing to be extracted to the outside, that is, loss of light. Further, the light-transmissive resin being in contact with at least part of the inner surface of the groove improves adhesion between the light-transmissive resin and the package. Accordingly, a reduction in the light extraction efficiency of the light emitting device is prevented despite any heat emission of the light emitting element. Thus, a highly reliable light emitting device can be obtained.

The light reflecting resin is formed continuously from the lateral surfaces of the recess to the outer upper edge of the groove. The light reflecting resin deflects light output from the light emitting element toward the opening of the recess. The light reflecting resin is formed so as not to cover the lateral surfaces of the light emitting element. The light reflecting resin may be formed so that its inner end is positioned at the outer upper edge of the groove. Alternatively, the light reflecting resin may be formed to cover part of the inner surface of the groove.

In the following, a description will be given of embodiments of the present disclosure with reference to the drawings. Note that, the embodiments described below are for embodying the technical idea of the present disclosure, and not intended to limit the technical scope of the present disclosure. The structure described in one embodiment is applicable also to other embodiments unless otherwise specified. In the following description, while the terms referring to specific directions or positions (for example, "upper/top", "lower/bottom", "right", "left", and other terms including these terms) are used, these terms are used for facilitating understanding of the embodiment of the present invention with reference to the drawings. The meanings of these terms do not limit the technical scope of the present disclosure.

Note also that the size, positional relationship and the like of members shown in the drawings may be exaggerated for the sake of clarity. Further, those parts denoted by identical reference characters in a plurality of drawings are identical parts or members.

[Light Emitting Device According to First Embodiment]

Figure 1B:
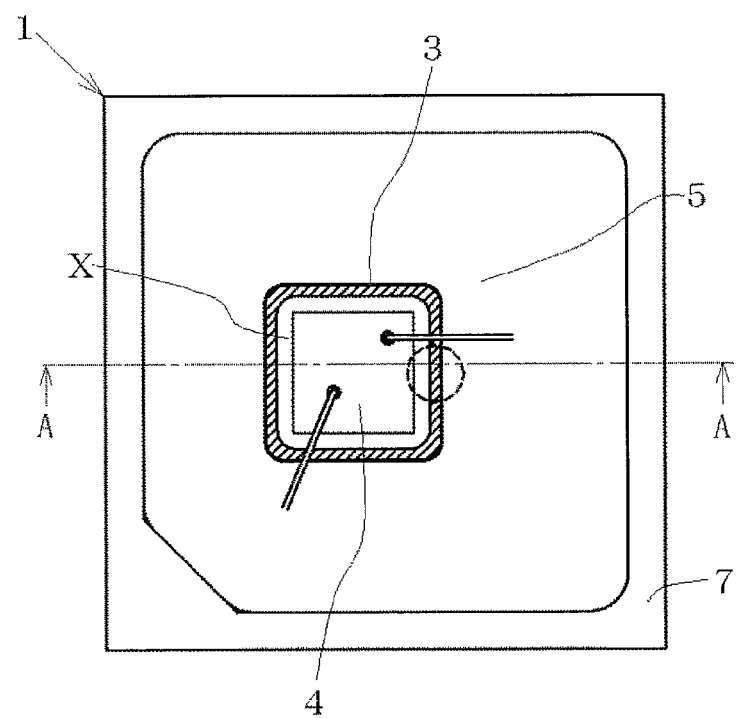
FIG. 1B is a schematic plan view of a light emitting device according to the first embodiment.
Figure 1C:
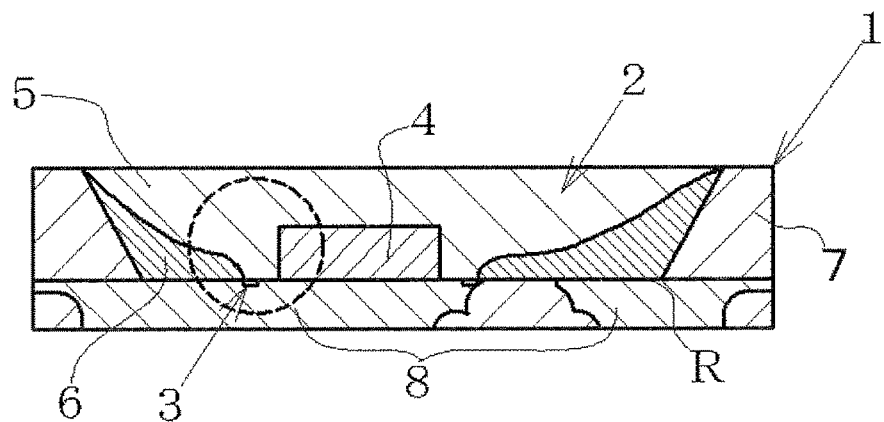
FIG. 1C is a schematic cross-sectional view taken along line A-A in FIG. 1B.
Figure 1D:
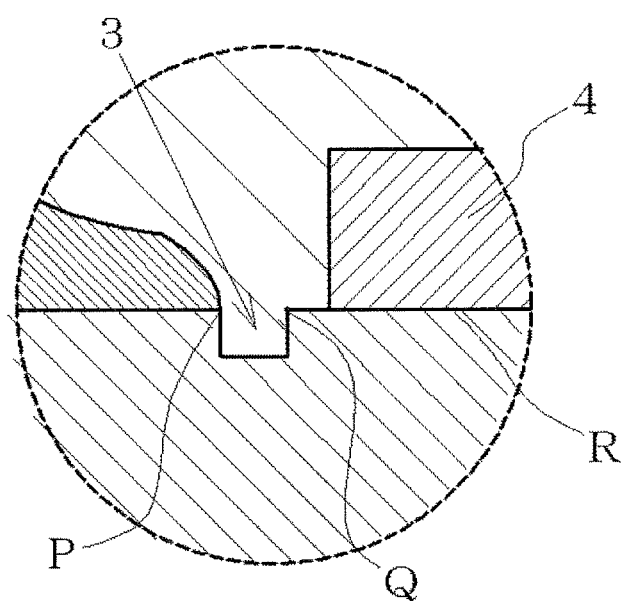
FIG. 1D is an enlarged view of a portion encircled by a broken line in FIG. 1C.

A description will be given of a light emitting device according to a first embodiment. FIG. 1A is a schematic perspective view showing a light emitting device 100 according to one embodiment of the present disclosure. FIG. 1B is a schematic plan view showing the light emitting device 100 according to one embodiment of the present disclosure. FIG. 1C is a schematic cross-sectional view taken along line A-A in FIG. 1B. FIG. 1D is an enlarged view of a portion encircled by a broken line in FIG. 1C.

The light emitting device 100 includes a package 1 having a recess 2, a light emitting element 4 mounted on the bottom surface of the recess 2, a light-transmissive resin 5 covering the light emitting element 4, and a light reflecting resin 6 that is formed continuously from the lateral surfaces of the recess 2 to a groove 3 formed at the bottom surface of the recess 2.

In the following, a detailed description of the package 1 will be given of an exemplary case where the package 1 is a resin package in which a molded body 7 and a pair of leads 8 are integrally formed.

(Package)

The package 1 includes the molded body 7 and the pair of leads 8 as the structuring elements. As shown in FIG. 1C, the package 1 has the recess 2. The recess 2 is structured by the inner lateral surfaces of the molded body 7 and part of the upper surface of the pair of leads 8. That is, at least part of the upper surface of the pair of leads 8 is exposed outside the molded body 7 at the bottom surface of the recess 2.

(Pair of Leads)

The pair of leads 8 has a region for the light emitting element 4 to be mounted, at part of the upper surface exposed outside the molded body 7 (hereinafter also referred to as the "element mounting region X"). The element mounting region X is defined by the groove 3 of which description will be given later.

The element mounting region X refers to a site that has a shape corresponding to the outer circumference of the light emitting element 4 disposed thereon, and corresponding to the planar shape of the light emitting element 4. That is, the outer shape of the element mounting region X preferably has a shape being identical to or substantially identical to the outer circumferential shape of the light emitting element 4 disposed thereon (for example, with the difference in area of ±10% or smaller).

The light emitting element 4 disposed on one element mounting region X may be one in number, or may be two or more. In the case where two or more light emitting elements 4 are disposed, the outermost shape of the disposed two or more light emitting elements 4 can be regarded as the above-described outer circumferential shape of the light emitting elements 4. Further, a plurality of element mounting regions X may be provided. In this case, one or two or more light emitting elements 4 are disposed for each element mounting region X.

The specific area of the element mounting region X can be set as appropriate depending on the plane area, the number of pieces, the arrangement state of the light emitting element 4 disposed thereon. When the light emitting element 4 is one in number, for example, the area of the element mounting region X is preferably 1.2 to 2 times greater than the plane area of the light emitting element 4, and more preferably 1.5 to 1.8 times greater than the plane area of the light emitting element 4.

The pair of leads 8 is formed by an electrically conductive material. The pair of leads 8 serves as an electrode portion, and the pair of leads 8 and the light emitting element 4 are electrically connected to each other by wires, for example. Further, in addition to the pair of leads 8, the package 1 may include a metal plate that does not serve as an electrode portion.

The pair of leads 8 has a base material and a plating layer that covers the base material. The base material may be metal such as Fe, Ni, Co, Ti, Sc, Nb, Zn, Zr, W, Mo, Ta, Cu, Al, Au, Pt, Ag, Rh, Ru, Pd, Os, Ir, Hf, V, Mn, Cr, La, Y, Sn and the like, or alloy of the foregoing metals. The base material may be a single layer, or may have a stacked-layer structure (for example, a cladding member). The main component is preferably Fe, Ni, or Cu. Further, as an element contained in trace amounts, non-metal such as Si and P may be contained. The material of the plating layer may be Ni, Pd, Au, and Ag, or alloy of the foregoing metals.

In the case where an Ag plating layer is disposed at the uppermost surface of the pair of leads 8, preferably a protective layer made of silicon oxide or the like is formed over the surface of the Ag plating layer. This suppresses the Ag plating layer from discoloring because of sulfur components in the air or the like. The protective layer can be formed by, for example, vacuum processing such as sputtering, or any other known method. The protective layer may be formed after the light emitting element 4 is mounted and after wires are provided and before the light reflecting resin 6 is provided. Alternatively, the protective layer may be formed partially at the portion where the recess 2 is exposed at after the light reflecting resin 6 is formed.

The thickness of the pair of leads is, for example, about 100 μm to 1000 μm.

(Molded Body)

The molded body 7 fixes the pair of leads 8. The molded body 7 may be made of resin such as thermosetting resin or thermoplastic resin. Specifically, the molded body 7 may be an epoxy resin composition, a silicone resin composition, a modified epoxy resin composition such as silicone-modified epoxy resin, a modified silicone resin composition such as epoxy-modified silicone resin, unsaturated polyester-based resin, a polyimide resin composition, a modified polyimide resin composition, polyphthalamide (PPA), polycarbonate resin, polyphenylenesulfide (PPS), liquid crystal polymer (LCP), ABS resin, phenolic resin, acrylic resin, PBT resin and the like. In particular, thermosetting resin is preferable. The molded body 7 preferably exhibits a reflectivity of 60% or more to light from the light emitting element 4, and more preferably exhibits a reflectivity of 70%, 80%, or 90% or more.

For example, the molded body 7 may contain a light reflecting material such as titanium oxide, silicon oxide, zirconium oxide, potassium titanate, aluminum oxide, zinc oxide, aluminum nitride, boron nitride, mullite and the like. Thus, light from the light emitting element 4 can be efficiently reflected. For example, when titanium oxide is employed, titanium oxide is preferably contained by 20 weight percent to 60 weight percent, and further preferably by 25 weight percent to 55 weight percent to the total weight of the resin member.

Further, in order to enhance contrast of the light emitting device, the molded body 7 may be of low light reflectivity to external light outside the light emitting device (in most cases, sunlight). In this case, normally the molded body 7 is preferably black or similar color. A filler therefor may be selected from, depending on the intended use, carbon such as acetylene black, activated carbon, graphite and the like, transition metal oxide such as iron oxide, manganese dioxide, cobalt oxide, molybdenum oxide and the like, or colored organic pigment and the like.

(Groove)

The groove 3 is formed at the upper surface of the pair of leads 8 exposed at the bottom surface of the recess 2, so as to surround the element mounting region X. The groove 3 has an outer upper edge P and an inner upper edge Q. As shown in FIG. 1D, the outer upper edge P is one of two edges (upper edges) opposing to each other in the width direction at the top of the groove 3, being the farther one from the element mounting region X, and the inner upper edge Q is the closer one. The groove 3 may be previously formed at the pair of leads 8 before the molded body 7 is molded. Alternatively, the groove 3 may be formed after the resin package 1 is formed.

Figure 2A:
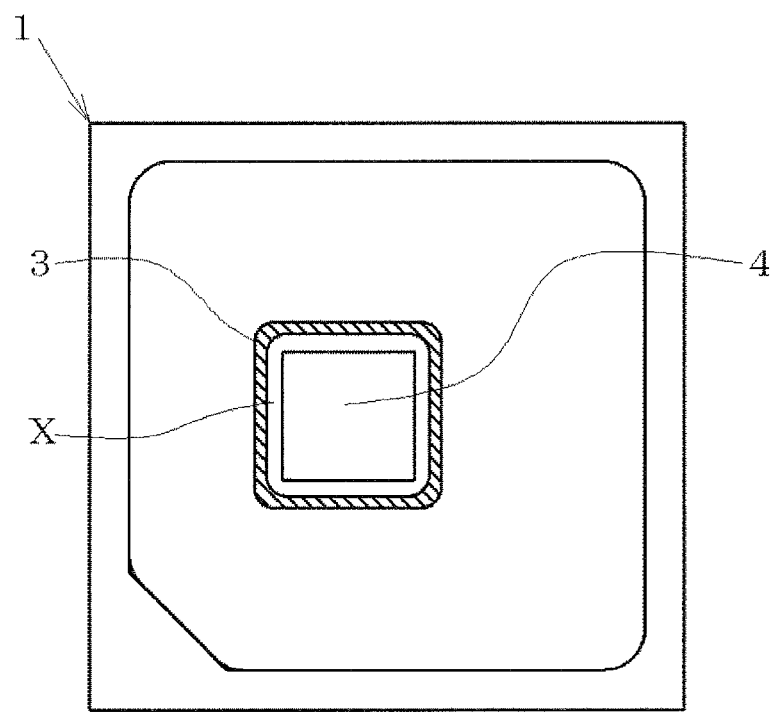
FIG. 2A is a schematic plan view showing the shape of a groove of the light emitting device according to the first embodiment.
Figure 2B:
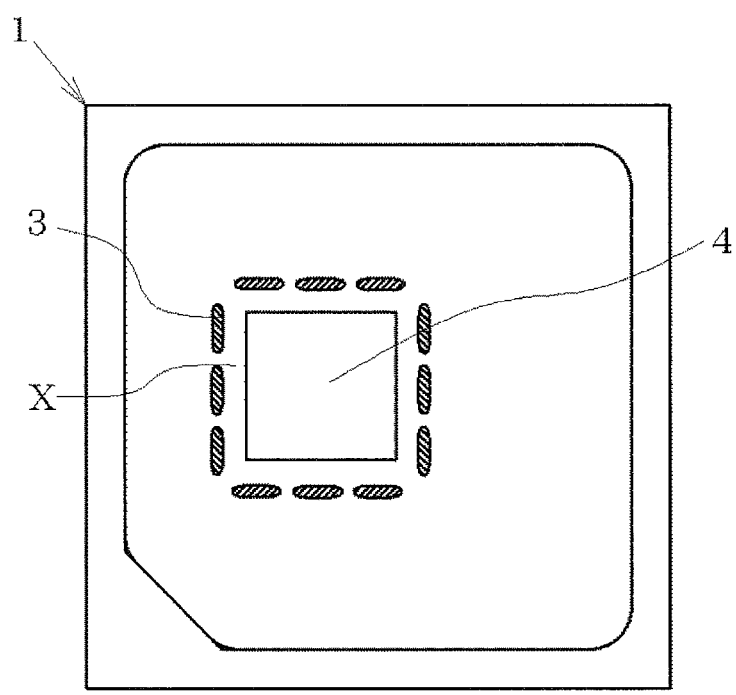
FIG. 2B is a schematic plan view showing the shape of the groove of the light emitting device according to the first embodiment.

The groove 3 is formed inner than the lateral surfaces of the recess 2 of the resin package 1, and serves as a stopper that suppresses the light reflecting resin 6 from reaching the lateral surfaces of the light emitting element 4. Accordingly, the groove 3 should be disposed between the region where the light reflecting resin 6 is formed and the light emitting element 4. For example, when the light reflecting resin 6 is formed over the entire circumference of the light emitting element 4, the groove 3 is disposed over the entire circumference of the light emitting element 4. The groove 3 may be linearly formed in a plan view as shown in FIG. 2A, or may be dotted as shown in FIG. 2B. In other words, the groove 3 may be one continuous groove as shown in FIG. 2A, or may be formed by a plurality of groove segments which are intermittently formed as shown in FIG. 2B. The distance between the groove segments is set to be small, so that the light reflecting resin 6 may partially enter the element mounting region X but is prevented from covering the lateral surfaces of the light emitting element 4. The distance between the groove segments is, for example, 1 μm to 100 μm, and preferably 10 μm to 50 μm. In any of the cases, the groove 3 is annularly disposed over the entire circumference of the light emitting element 4, in other words, in the region corresponding to all sides of the light emitting element 4. The shape of the groove 3 is appropriately specified. For example, the groove 3 may be quadrangular, rectangular, polygonal, circular, elliptical, and a combination of the foregoing in a plan view.

Figure 2C:
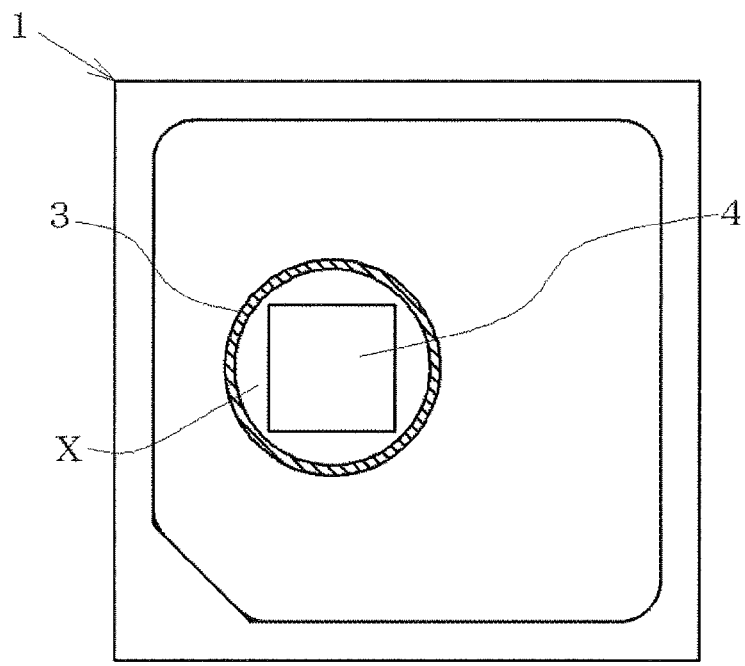
FIG. 2C is a schematic plan view showing the shape of the groove of the light emitting device according to the first embodiment.

When the outer circumferential shape of the groove 3 is circular in a plan view, as shown in FIG. 2C, the inner shape of the light reflecting resin 6 formed around the groove 3 becomes circular. Such a light reflecting resin 6 with no corners can reduce the light components attenuated at the corners, out of the light components having been output from the light emitting element 4. Accordingly, a light emitting device with high light extraction efficiency can be obtained. Further, the shape of the light emitting element 4 in this case in a plan view preferably approximates a circle such as a hexagon, so as to conform to the circular shape of the groove 3. Such a structure enables to employ the light emitting element 4 of a relatively greater area with the element mounting region X of the identical area, and hence the light extraction efficiency improves.

Figure 2D:
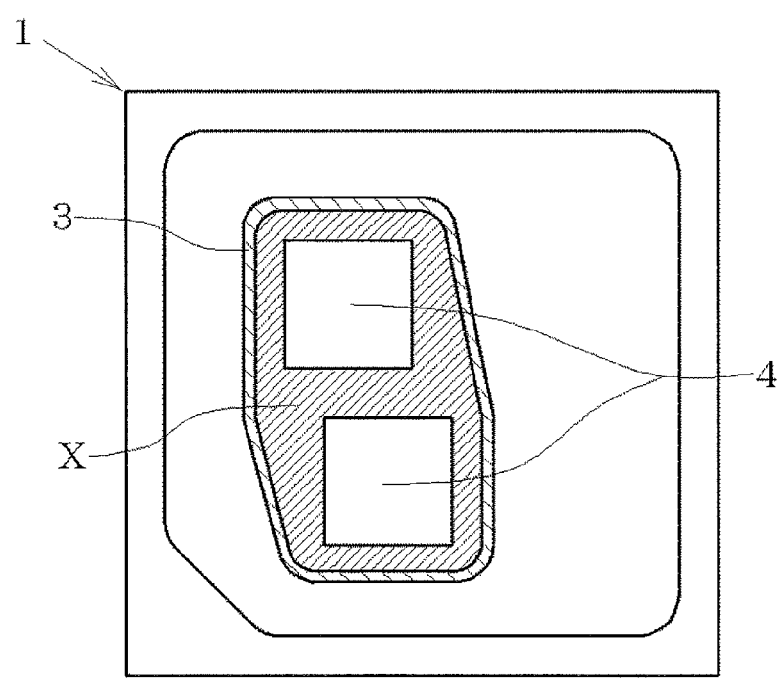
FIG. 2D is a schematic plan view showing the shape of the groove of the light emitting device according to the first embodiment.

Further, as shown in FIG. 2D, the groove 3 or the element mounting region X may be asymmetric in a plan view. Such an asymmetric shape varies, by the direction, the number of fluorescent material particles disposed in the element mounting region X excluding the light emitting element 4. Accordingly, the light distribution color temperature of the light emitting device can be controlled easier.

Further, as shown in FIG. 2D, when a plurality of light emitting elements 4 are disposed in the element mounting region X, a plurality of light emitting elements 4 are preferably staggered in the top-bottom direction or in the right-left direction in a plan view. Such a disposition can suppress light output in the lateral surface direction of the light emitting element 4 from being absorbed by the other adjacent light emitting element 4. In this case, when the length of the long side of the light emitting element 4 (the length of one side when the light emitting element 4 is square) in a plan view is L, the distance on a plane from the lateral surface of one light emitting element to the lateral surface of the adjacent light emitting element in the same direction is preferably greater than L/10, further preferably greater than L/3, and particularly preferably greater than L.

Figure 2E:
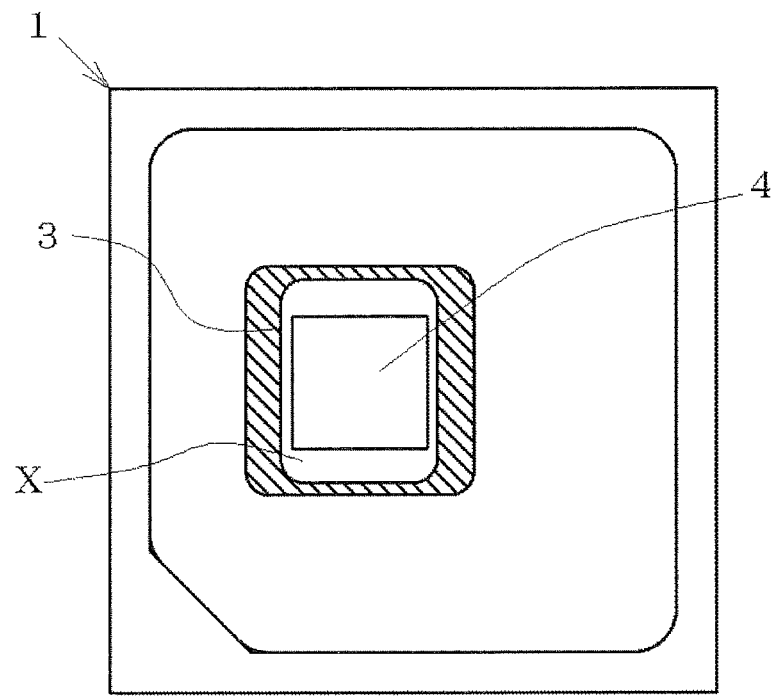
FIG. 2E is a schematic plan view showing the shape of the groove of the light emitting device according to the first embodiment.

Further, as shown in FIG. 2E, the width of the groove 3 may be varied. In other words, the groove 3 may partially include a great-width region. Such a shape enables to vary the number of fluorescent material particles disposed in the groove 3. This makes it easier to control the light distribution of the light emitting device, such as to raise the color temperature in the intended direction. Here, the maximum width value of the groove 3 is at least 1.5 times greater than the minimum width value thereof. In FIG. 2E, the width of the groove 3 assumes the maximum value at the regions formed in the right-left direction of the light emitting element 4 in a top view, and assumes the minimum value at the regions formed in the top-bottom direction of the light emitting element 4 in a top view.

Further, as shown in FIGS. 2C to 2E, the distance from each of the lateral surfaces of the light emitting element 4 to the groove 3 may not be uniform and may be varied. Then, since the distance from the light emitting element 4 to the light reflecting resin 6 can be increased or reduced in any direction, the light distribution of the light emitting device itself can be controlled as desired.

Figure 2F:
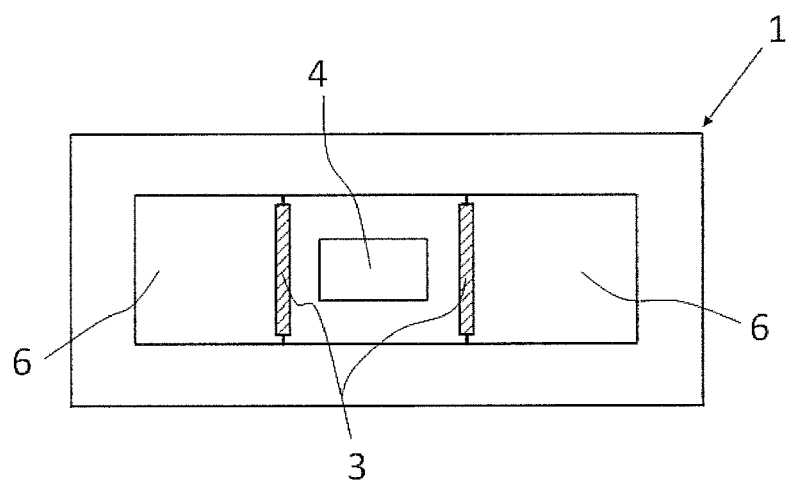
FIG. 2F is a schematic plan view showing the shape of the groove of the light emitting device according to the first embodiment.

Further, as shown in FIG. 2F, in the case where the light reflecting resin 6 is formed not over the entire circumference of the light emitting element 4, but at part of the circumference of the light emitting element 4, for example, at the region in the circumference of the light emitting element 4 corresponding to one to three sides of the light emitting element 4 being quadrangular in a plan view, the groove 3 is disposed at the position corresponding to the one to three sides. In other words, there is a region with no groove 3 between the light emitting element 4 and the lateral surfaces of the recess 2. Such a non-annular groove 3 may be straight, curved, or a combination thereof. Such a non-annular groove 3 is formed to be spaced apart from the inner walls of the recess 2. If the groove 3 reached the inner wall of the recess 2, the molded body 7 would disadvantageously enter the groove 3 during molding the molded body 7, thereby burying the groove 3. In the state where the groove 3 is buried by the molded body 7, the light reflecting resin 6 may not be stopped by the groove 3. Accordingly, the groove 3 is disposed to be spaced apart from the inner walls of the recess 2 so as to prevent the groove 3 from being buried.

The light emitting device shown in FIG. 2F includes two grooves 3 and two light reflecting resins 6. More specifically, the light emitting device shown in FIG. 2F has a substantially quadrangular outer shape having a long-side direction and a short-side direction being perpendicular to the long-side direction in a top view. The two grooves 3 extend in the short-side direction, so that two lateral surfaces of the light emitting element 4 are arranged between them. Here, the two grooves 3 are disposed near the light emitting element 4, and formed to be spaced apart from the lateral surfaces of the light emitting element 4. On the other hand, the two light reflecting resins 6 are formed respectively from the two lateral surfaces in the long-side direction of the recess 2 to the grooves 3. The light emitting device in this structure requires a reduced amount of resin for forming the light reflecting resins 6, and therefore is cost-effective. While the light emitting device of which outer shape is rectangular in a top view has been exemplarily described, the outer shape of the light emitting device is appropriately specified. For example, a light emitting device of which outer shape is square in a top view can exhibit the similar effect.

As described above with reference to FIGS. 2A to 2F, the groove 3 may be disposed over the entire circumference of the light emitting element 4 or may be disposed at part of the circumference of the light emitting element 4. Both of the states are meant by "surrounding the light emitting element".

The groove 3 is formed at the bottom surface of the recess 2 so as to be spaced apart from the lateral surfaces of the recess 2. If the groove 3 reached the lateral surfaces of the recess 2, the molded body 7 would disadvantageously enter the groove 3 during molding the molded body 7, thereby burying the groove 3. Here, "the groove 3 being buried" includes the state where the molded body 7 is formed at part of the groove 3, and the state where the groove 3 is filled with the molded body 7 whereby the upper surface of the filling molded body 7 and a first main surface R of the pair of leads 8 are flush with each other. When the groove 3 is buried, the light reflecting resin 6 may not be stopped by the groove 3. Accordingly, the groove 3 is disposed to be spaced apart from the lateral surfaces of the recess 2 so as to prevent the groove 3 from being buried.

The groove 3 stops the light reflecting resin 6, of which description will be given later, from reaching the lateral surfaces of the light emitting element 4. This suppresses loss of light caused by the light reflecting resin 6 covering the lateral surfaces of the light emitting element 4. The groove 3 can be provided at the first main surface of the lead frame (a metal plate which is singulated later to provide the pair of leads 8) by press processing, etching processing, or a height difference created by the thickness of the plating layer. Further, other methods normally employed for processing a lead frame can be employed, such as laser light radiation, cleaving, blasting and the like. Subjecting the lead frame to such processing, at least part of or the entire inner surface of the groove 3 is formed at a lower position than the first main surface of the lead frame before the processing.

The groove 3 may be formed in processing the lead frame to provide the pair of leads 8 of the predetermined shape. Alternatively, the groove 3 may be formed in a separate operation after the pair of leads 8 is obtained from the lead frame. In the following, exemplary processing of the groove 3 is detailed.

(Press Processing)

Figure 3A:
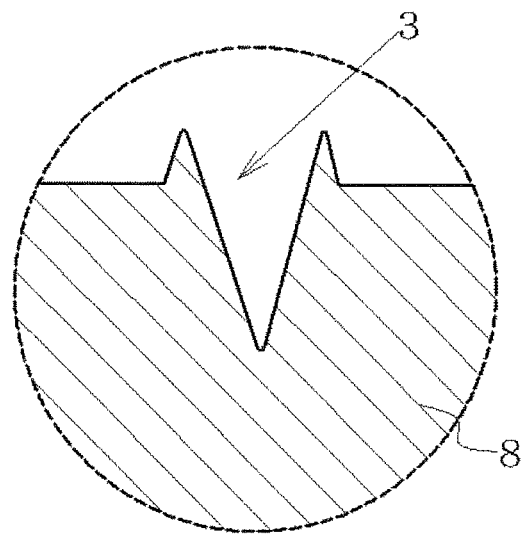
FIG. 3A is a schematic cross-sectional view showing the shape of the groove of the light emitting device according to the first embodiment.
Figure 3B:
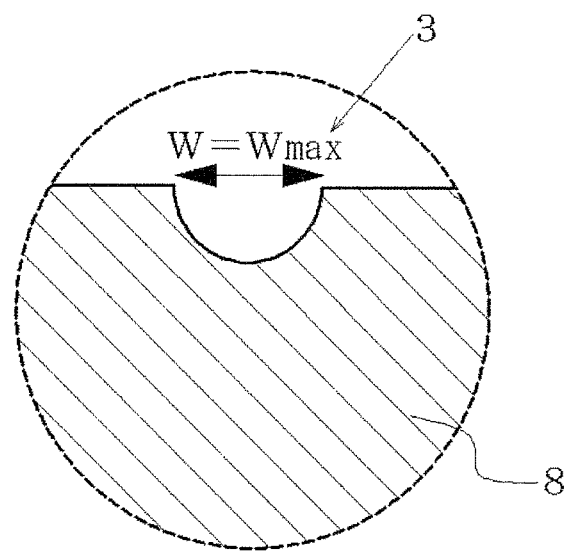
FIG. 3B is a schematic cross-sectional view showing the shape of the groove of the light emitting device according to the first embodiment.
Figure 3C:
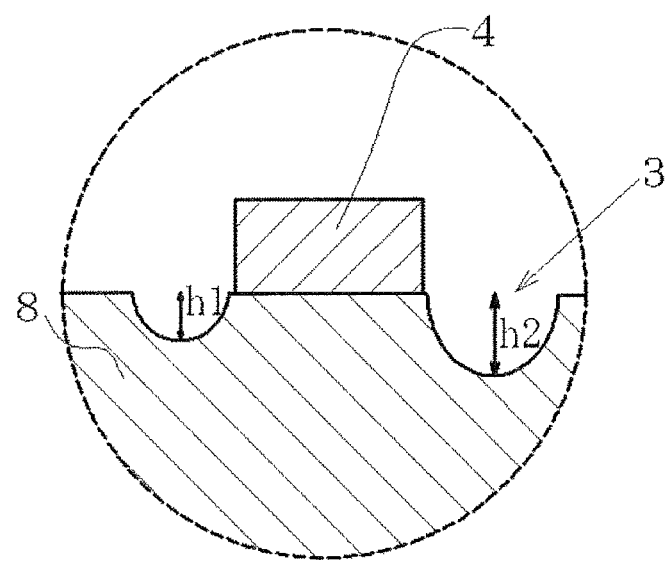
FIG. 3C is a schematic cross-sectional view showing the shape of the groove of the light emitting device according to the first embodiment.

When the groove 3 is formed by press processing, the groove 3 can be formed by applying strong force to the first main surface of the lead frame using any tool. Thus, the groove 3 that does not penetrate through the lead frame can be formed. Further, the shape (the shape in a plan view or the shape in the depth direction) or the depth of the groove 3 can be changed by changing the shape of the tip of the processing tool. While the depth of the groove 3 should be appropriately specified, the depth is preferably 5% to 70% as great as the thickness of the metal plate, more preferably 10% to 65% as great as the thickness of the metal plate. FIGS. 3A to 3C are enlarged cross-sectional views of a portion encircled by a broken line and taken along line A-A in FIG. 1B. Though FIG. 3A shows a V-shaped (triangular) cross section, the shape may be appropriately specified, and may be a polygonal shape such as quadrangular, rectangular, trapezoidal and the like.

Further, by forming the groove 3 by pressing as described above, regions being higher than the reference plane of the lead frame can be formed around the groove 3 as shown in FIG. 3A. The pressing the lead frame bulges the regions around the pressed portion. Thus, the regions being higher than the reference plane of the pair of leads 8 can be formed. Forming the higher regions than the reference plane more efficiently stop the flow of the light reflecting resin 6.

(Etching Processing)

When the groove 3 is formed by etching processing, for example wet etching using etchant may be employed. In this case, using a mask pattern that masks or opens the intended shape on one surface of the lead frame, the groove 3 can be finely formed at the lead frame which is difficult to be achieved with mechanical processing.

In the cross-sectional shape of the groove 3, for example as shown in FIG. 3B, a width W between the inner upper edge Q and the outer upper edge P attains a maximum width dimension Wmax in a depth direction D. As used herein, the "depth direction D" is the direction from the upper surface of the pair of leads 8 toward the lower surface thereof. In other words, the groove 3 has a hemispherical or semi-ellipsoidal shape where Wmax=W. In the case where Wmax=W is established, the opening of the groove 3 is the widest in a cross-sectional view. Thus, light from the light emitting element 4 is prevented from being confined in the groove 3 and resulting in loss of the light.

Further, the cross-sectional shape of the groove 3 may have a maximum width dimension Wmax being greater than the width W between the inner upper edge Q and the outer upper edge P in the depth direction D. In other words, the groove 3 has a cross-sectional shape in which the maximum width dimension Wmax inside the groove 3 is greater than the width W of the opening at the surface of the pair of leads 8. As compared to the groove 3 having a cross-sectional shape in which the width W=the maximum width dimension Wmax, the groove 3 is greater in length of the inner surface of the groove 3 in a cross-sectional view. This increases the surface area where the resin with which the groove 3 is filled (the light-transmissive resin 5 or the light reflecting resin) and the inner surface of the groove 3 are in contact with each other. Accordingly, the resin with which the groove 3 is filled can be effectively prevented from being detached from the pair of leads 8.

Further, in the cross-sectional shape of the groove 3 (Wmax>W), the region necessary for the groove 3 at the surface of the pair of leads is reduced, and the groove 3 is reduced also in the depth direction. Accordingly, while the region necessary for forming the groove 3 being reduced, the groove 3 can be filled with a greater amount of resin. Further, since the groove 3 of which cross section is circular can be formed by wet etching, it is suitable for a light emitting device of a small size with which mechanical formation of the groove 3 is difficult.

Still further, as shown in FIG. 3C, in the cross-sectional shape of the groove 3, the distance from the opening of the groove 3 to its deepest site may vary. This enables to vary the particle distribution of the fluorescent material with which the groove 3 is filled. Thus, light distribution control such as increasing the color temperature in the intended direction becomes possible. Further, the light component intentionally confined in the groove 3 can be adjusted by varying the depth of the groove 3. Therefore, a light emitting device having gradations in lighting can be obtained. For example, light output in the direction where the depth of the groove 3 is great is extracted as relatively dim light.

(Other Processing)

Other processing includes forming the groove 3 by a height difference created by the thickness of a plating layer. The pair of leads 8 has a plating layer for light from the light emitting element 4 to be efficiently extracted. The plating layer is preferably formed after the lead frame is processed (patterned).

Figure 4A:
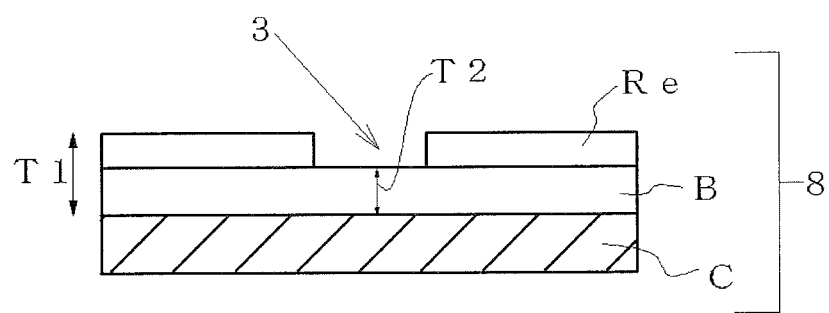
FIG. 4A is a schematic cross-sectional view showing a plating layer of the light emitting device according to the first embodiment.

When the groove 3 is formed by the plating layer, a mask is formed at the position of the lead frame corresponding to the groove 3. Thus, as shown in FIG. 4A, the plating on the pair of leads 8 has a thick portion TI and a thin portion T2 differing from each other in thickness (T2<T1). Here, the height difference created by the difference in thickness between the thick portion TI and the thin portion T2 provides the groove 3.

The plating layer is specifically formed as follows. As shown in FIG. 4A, on the base material C (e.g., Cu) of the lead frame, a barrier layer of which main component is Au, Ni, or Pd or a combination of the foregoing elements that prevents diffusion of the base material C is formed. Then, a mask is formed at the position corresponding to the groove 3, and a reflecting layer Re of which main component is for example Ag is formed on the barrier layer B. In this manner, the thick portion Ti where the Ag plating layer is formed and the thin portion T2 where no Ag plating layer is formed can be formed, and the site formed by the difference in thickness (height) between the thick portion T1 and the thin portion T2 becomes the groove 3. While the Ag plating layer is susceptible to discoloring due to corrosive gas such as sulfidizing gas in the atmosphere, such a disposition reduces the exposed area of the Ag plating layer which is susceptible to corrosion. Thus, the pair of leads 8 can be suppressed from discoloring due to corrosive gas entering the recess 2.

Figure 4B:
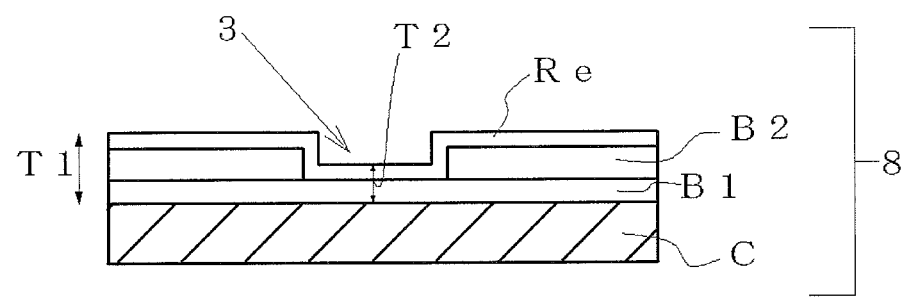
FIG. 4B is a schematic cross-sectional view showing the plating layer of the light emitting device according to the first embodiment.

In another method of forming the plating layer (forming the groove 3), as shown in FIG. 4B, on the base material C (e.g., Cu) of the lead frame, a first barrier layer B1 of which main component is for example Ni is formed. Next, a mask is formed at the position corresponding to the groove 3 is formed, and a second barrier layer B2 of which main component is for example Au or Pd or a combination of the foregoing elements is formed. Then, a reflecting layer Re having a uniform thickness and of which main component is for example Ag is formed on the barrier layer B1, B2. Through such forming, the inner surface of the groove 3 is plated with Ag. Accordingly, by virtue of the uppermost surfaces of the lead frame and the groove 3 being provided with a reflecting layer Re exhibiting high light reflectivity, light output from the light emitting element 4 can be efficiently extracted.

(Light-Transmissive Resin)

The light-transmissive resin 5 covers the light emitting element 4, and is in contact with at least a part of the inner surface of the groove 3. The light-transmissive resin 5 being in contact with at least part of the inner surface of the groove 3 exhibits the following effect. Provided that the light reflecting resin 6 expands by the heat from the light emitting element 4 and invites stress for creeping up the lateral surfaces of the light emitting element 4, the light-transmissive resin 5 (in particular, the light-transmissive resin 5 positioned at the inner surface of the groove 3) can apply stress in the direction counter to the stress. As a result, the light reflecting resin 6 is prevented from covering the lateral surfaces of the light emitting element 4, which would otherwise result in light from the light emitting element 4 failing to be extracted to the outside, that is, loss of light. Further, the light-transmissive resin 5 being in contact with at least part of the inner surface of the groove 3 improves adhesion between the light-transmissive resin 5 and the pair of leads 8. Accordingly, a reduction in the light extraction efficiency of the light emitting device is prevented despite any heat emission of the light emitting element 4. Thus, a highly reliable light emitting device can be obtained.

The material of the light-transmissive resin 5 may be the resin material structuring the molded body 7. For example, it may be silicone resin, epoxy resin, acrylic resin or resin including at least one of the foregoing resins. The light-transmissive resin 5 may be a single layer, or may be structured by a plurality of layers (for example, two layers including an underfill and an overcoat). Further, in the light-transmissive resin 5, light scattering particles such as titanium oxide, silicon oxide, zirconium oxide, zinc oxide, aluminum oxide, aluminum nitride and the like may be dispersed.

Further, in the light-transmissive resin 5, particles of a material that coverts the wavelength of light from the light emitting element 4 (a fluorescent material or the like) may be dispersed. Specific fluorescent material may be cerium-activated yttrium-aluminum-garnet, cerium-activated lutetium-aluminum-garnet, europium and/or chromium-activated nitrogen-containing calcium aluminosilicate (strontium may substitute for part of calcium), europium-activated sialon, europium-activated silicate, europium-activated strontium aluminate, manganise-activated potassium fluosilicate or the like.

(Light Reflecting Resin)

The light reflecting resin 6 is formed continuously from the lateral surfaces of the recess 2 to the outer upper edge P of the groove 3. The light reflecting resin 6 deflects light output from the light emitting element 4 toward the opening of the recess 2. As used herein, "formed continuously" includes the state where, as shown in FIG. 1C, the light reflecting resin 6 is wholly formed continuously from the lateral surfaces of the recess 2 to the groove 3, and the state where, as shown in FIG. 2F, a plurality of light reflecting resins 6 are formed. Further, as shown in FIG. 5, the reflecting surface of the light reflecting resin 6 is inclined from the bottom surface of the recess 2 toward the opening of the recess 2. An inclination angle α formed between the line connecting between the upper end and lower end of the reflecting surface of the light reflecting resin 6 and the bottom surface of the recess 2 is preferably smaller than an inclination angle β formed between the line connecting between the upper end and lower end of the inclined surface of the molded body 7 and the bottom surface of the recess 2. Such a disposition suppresses the light that has been output from the light emitting element 4 and that has reflected at the light reflecting resin 6 from returning toward the light emitting element 4. Thus, the light extraction of the light emitting device improves.

Figure 6A:
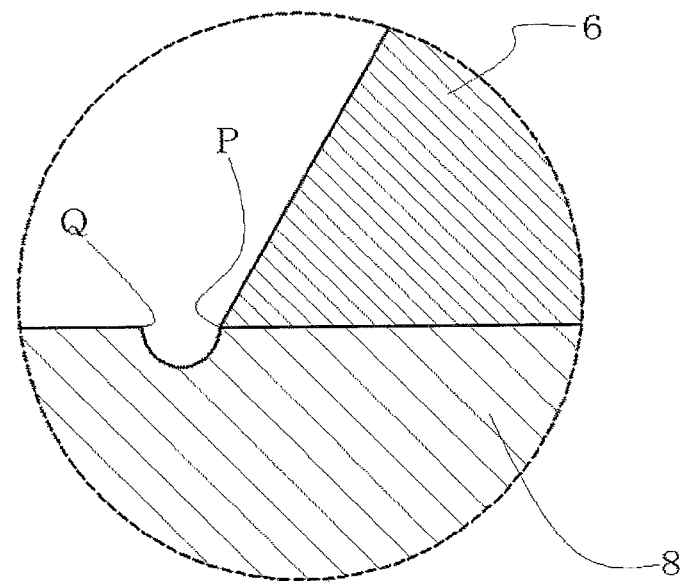
FIG. 6A is a schematic cross-sectional view showing the shape of the groove of the light emitting device according to the first embodiment.
Figure 6B:
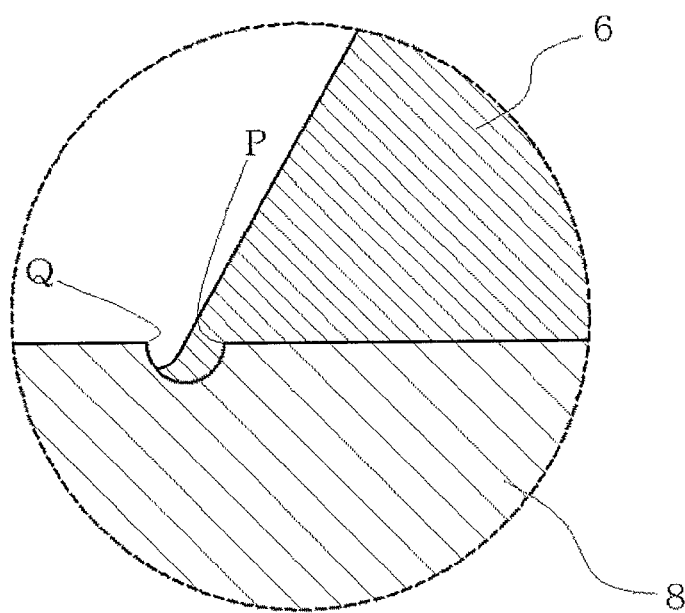
FIG. 6B is a schematic cross-sectional view showing the shape of the groove of the light emitting device according to the first embodiment.

The light reflecting resin 6 reaching at least the outer upper edge P of the groove 3 will suffice. For example, as shown in FIG. 6A (an enlarged cross-sectional view of a portion encircled by a broken line and taken along line A-A in FIG. 1B), the end of the light reflecting resin 6 may be positioned at the outer upper edge P of the groove 3 with each other. Alternatively, as shown in FIG. 6B (an enlarged cross-sectional view of a portion encircled by a broken line and taken along line A-A in FIG. 1B), a part of the light reflecting resin 6 may cover the outer upper edge P and the inner surface of the groove 3. The light reflecting resin 6 partially covering the inner surface of the groove 3 is preferable because it increases the surface area where the light reflecting resin 6 and the pair of leads 8 are in contact with each other and improves adhesion between the members. Further, heat transferred from the light emitting element 4 to the light reflecting resin 6 can be released outside via the pair of leads 8. This prevents the light reflecting resin 6 from expanding because of heat. Further, both the light reflecting resin 6 and the light-transmissive resin 5 may exist in the groove 3. Thus, as compared to the case where only one of the light-transmissive resin 5 and the light reflecting resin 6 exists in the groove 3, by virtue of both the light-transmissive resin 5 and the light reflecting resin 6 exhibiting the anchoring effect in the groove 3, adhesion among the pair of leads 8, the light-transmissive resin 5, and the light reflecting resin 6 improves.

The light reflecting resin 6 is higher in reflectivity than the molded body 7. In other words, the light reflecting substance contained in the light reflecting resin 6 (e.g., titanium oxide) is greater in amount than the light reflecting substance contained in the molded body 7. The light reflecting substance contained in the light reflecting resin 6 is preferably 1.5 times or more greater than the light reflecting substance contained in the molded body 7, and more preferably twice or more greater, and particularly preferably 2.5 times or more greater. For example, the light reflecting resin 6 contains titanium oxide by 40 weight percent.

The light reflecting resin 6 is preferably made of resin that is uneasily discolored by light or heat as compared to the molded body 7. The site directly exposed to light or heat from the light emitting element 4 is particularly susceptible to discoloring. Accordingly, for example, the surface of the molded body 7 made of epoxy-based resin is preferably covered with the light reflecting resin 6 made of silicone-based resin which is less susceptible to discoloring than the molded body 7.

The light reflecting resin 6 preferably has high viscosity. For example, the viscosity of the light reflecting resin 6 is 1 Pa·s to 100 Pa·s, and more preferably 5 Pa·s to 10 Pa·s. This prevents the light reflecting resin 6 from crossing the inner upper edge Q of the groove 3 to reach the lateral surface of the light emitting element 4 during forming the light reflecting resin 6.

The light reflecting resin 6 is preferably higher in light reflectivity than the plating layer (e.g., Ag plating) of the pair of leads 8. As used herein, being "higher in light reflectivity" means that the average value of the light reflectivity of the light reflecting resin 6 relative to all the wavelengths of light emitted from the light emitting element 4 is higher than that of the plating layer. Note that, provided that the light reflecting resin 6 is lower in light reflectivity than the plating layer, a light emitting device with improved light extraction efficiency can be obtained by improving the light extraction effect by: covering the wires that absorb light from the light emitting element 4 with the light reflecting resin 6; or more upwardly orientating the reflecting surface of the light reflecting resin 6 that upwardly deflects light from the light emitting element 4 (inclination angle α<inclination angle β).

The light reflecting resin 6 is just required to cover at least part of the lateral surfaces of the recess 2 in a cross-sectional view. In particular, as shown in FIG. 1C, the light reflecting resin 6 preferably covers the entire lateral surfaces of the recess 2. In other words, the upper end of the light reflecting resin 6 may be positioned at the upper end of the lateral surface of the recess 2. In this manner, by virtue of the lateral surfaces of the recess 2 being covered with the light reflecting resin 6 being higher in light reflectivity than the molded body 7, a light emitting device with excellent light extraction efficiency can be obtained.

As shown in FIG. 1B, the light reflecting resin 6 preferably covers the entire region of the bottom surface of the recess 2 excluding the element mounting region X and at least a part of the groove 3. In particular, the light reflecting resin 6 is provided such that electronic components such as the bonding region of the electrically conductive wires extending to the light emitting element 4 and connected to the electrode portion (pair of leads 8) and the protective element are partially or entirely buried. This prevents light from the light emitting element 4 from being absorbed by the electrically conductive wires and the protective element. Here, covering the bonding region of the wires with the light reflecting resin 6 being smaller in thermal expansion coefficient than the light-transmissive resin 5 reduces thermal stress at the bonding region of the wires where disconnection tends to occur. Thus, disconnection of the wires can be prevented.

The light reflecting resin 6 is preferably made of a material that little transmits or absorbs light from the light emitting element 4 or external light. For example, the light reflecting resin 6 may include thermosetting resin or thermoplastic resin as a base material. More specifically, the light reflecting resin 6 may include phenolic resin, epoxy resin, BT resin, PPA, silicone resin and the like as the base material. Light scattering particles are dispersed in any of these resins as the base material. The light scattering particles is a reflecting material which little absorbs light from the light emitting element 4 and is greater in difference in refractive index from the resin being the base material (e.g., titanium oxide, silicon oxide, zirconium oxide, aluminum oxide, aluminum nitride). Thus, light can be reflected efficiently.

(Light Emitting Element)

The light emitting element 4 may be a semiconductor light emitting element such as a light emitting diode. The light emitting element 4 is just required to have an element structure made up of various semiconductors, and a pair of positive and negative electrodes. In particular, the light emitting element 4 is preferably a nitride semiconductor ($In_xAl_yGa_{1-x-y}N$, $0 \leq x$, $0 \leq y$, $x+y \leq 1$) capable of emitting light of an ultraviolet to visible light region. Additionally, the light emitting element 4 may be a gallium-arsenide-based, gallium-phosphide-based semiconductor that emits green-, red-color light. The light emitting element 4 often includes a substrate. The substrate is preferably light-transmissive, but may be specified as appropriate. The base material of the substrate may be sapphire, gallium nitride, aluminum nitride, silicon, silicon carbide, gallium arsenide and the like. With the light emitting element 4 in which the pair of positive and negative electrodes are provided on the same surface, the electrodes are connected to lead electrodes by wires, i.e., face-up mounted. With the light emitting element 4 having an opposite electrode structure in which the pair of positive and negative electrodes are respectively provided on the opposite surfaces, the lower-surface electrode is bonded to the lead electrode by an electrically conductive adhesive agent, and the upper-surface electrode is connected to the lead electrode by a wire. The light emitting element 4 mounted on one package may be one or two or more in number. A plurality of light emitting elements 4 can be connected in series or parallel with wires. Further, for example, three light emitting elements 4 respectively emitting light of blue-, green-, red-color light may be mounted on one package.

(Method of Manufacturing Light Emitting Device According to First Embodiment)

In the following, a description will be given of an exemplary method of manufacturing the light emitting device according to the first embodiment.

The method of manufacturing the light emitting device according to the first embodiment includes: providing the package 1 on which the light emitting element 4 is mounted; forming the light reflecting resin 6 to surround the element mounting region X of the light emitting element 4; and forming the light-transmissive resin 5 that covers the light emitting element 4 and is in contact with the inner surface of the groove 3.

(1. Providing Package)

Firstly, the metal plate is subjected to punching, so that a lead frame having pairs of leads 8 is formed. Then, by wet etching, linear or dotted groove 3 is formed at a predetermined position of each pair of leads 8. After the groove 3 is formed, a plating layer made of at least one of Ni, Pd, Au, and Ag or combinations of them is formed at the surface of the lead frame. Further, the plating layer at the surface of the lead frame may be provided after the molded body 7 is formed. Thereafter, the lead frame provided with the groove 3 is set in a mold assembly having an upper mold having a projection and a lower mold. The region set at the projection corresponds to the recess 2 of the package 1, and the region not set at the projection defines an opening where the molded body 7 is formed. Here, the groove 3 is disposed to be interposed between the projection of the upper mold and the lower mold. This prevents the groove 3 from being buried by the molded body 7.

Next, into the mold assembly having the upper mold and the lower mold closed, the molded body 7 is transfer-molded so that the molded body 7 is formed on the lead frame. Here, the method of forming the molded body 7 may be injection molding or compression molding, in place of transfer molding.

Next, the light emitting element 4 is mounted on the element mounting region X of the lead frame provided with the molded body, using a die bonding member. Here, the groove 3 (in particular, the inner upper edge of the groove 3) stops the die bonding member from excessively spreading, and prevents the die bonding member from covering the bonding region of the wires. Further, the die bonding member is preferably disposed such that the surface tension acting at the inner upper edge of the groove 3 prevents the die bonding member from entering the groove 3. Thus, the groove 3 is prevented from being buried by the die bonding member. Then the light emitting element 4 is electrically connected to the lead frame by wires.

<2. Forming Light Reflecting Resin>

In forming the light reflecting resin 6, the light reflecting resin 6 is formed so as to surround the element mounting region X of the light emitting element 4 and to cover at least part of the wires. Here, the light reflecting resin 6 preferably covers at least the bonding region where the wires and the lead frame are connected to each other. More preferably, the light reflecting resin 6 covers the wires by 50% or more length. This reduces light having output from the light emitting element 4 being absorbed by the wires.

The light reflecting resin 6 is formed by potting. In the case where the light reflecting resin 6 is formed by potting, for example, the light reflecting resin 6 is dripped at any one point (one point application) in the bottom surface of the recess 2, and allowed to flow naturally. This manner is preferable because the light reflecting resin 6 can be formed with ease. Further, in place of the foregoing manner, the light reflecting resin 6 may be formed by performing potting at the corners or ends of the recess 2. For example, when the bottom surface of the recess 2 is quadrangular in a plan view, the light reflecting resin 6 may be dripped at four corners (four point application). This makes it possible to surely form the light reflecting resin 6 at the corners where light tends to attenuate, and hence a light emitting device with excellent light extraction efficiency can be manufactured. The number of times of performing potting is not limited thereto and can be appropriately specified.

Further, in the case where the light reflecting resin 6 is formed by potting, the light reflecting resin 6 is preferably provided so as to cover part of or bury the entire electronic component such as the protective element. This prevents light from the light emitting element 4 from being absorbed by the protective element or the like.

<3. Forming Light-Transmissive Resin>

Next, the light-transmissive resin 5 that covers the light emitting element 4 and is in contact with the inner surface of the groove 3 is formed. Here, the light-transmissive resin 5 preferably contains fluorescent material particles. The light-transmissive resin 5 may be formed by potting or the like.

Then, the lead frame is singulated into individual light emitting devices. The singulation can be performed by various methods, such as singulating using a lead-stamping die or a dicing saw, or by laser light.

[Light Emitting Device According to Second Embodiment]

Figure 7A:
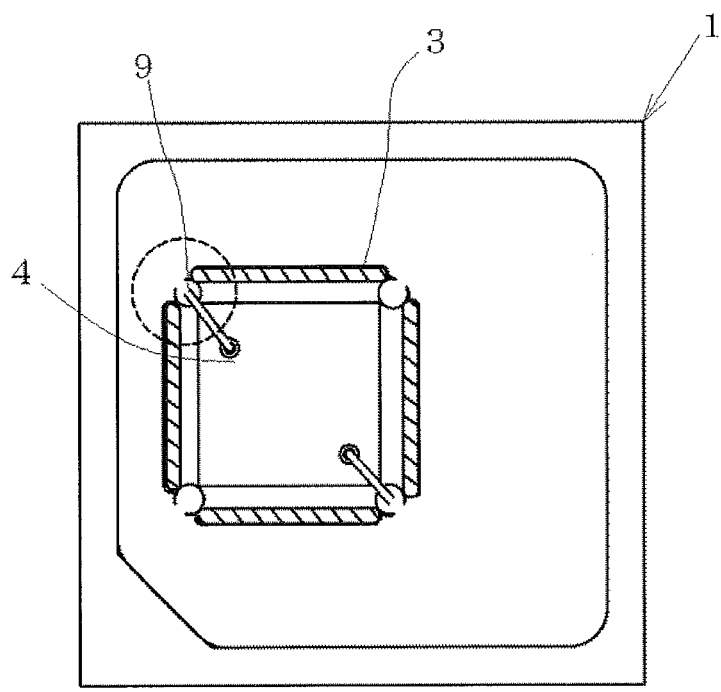
FIG. 7A is a schematic plan view of a light emitting device according to a second embodiment.
Figure 7B:
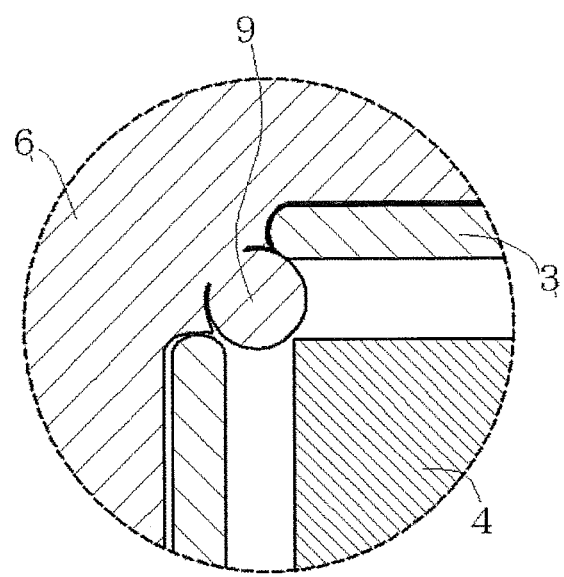
FIG. 7B is an enlarged view of a portion encircled by a broken line in FIG. 7A.
Figure 7C:
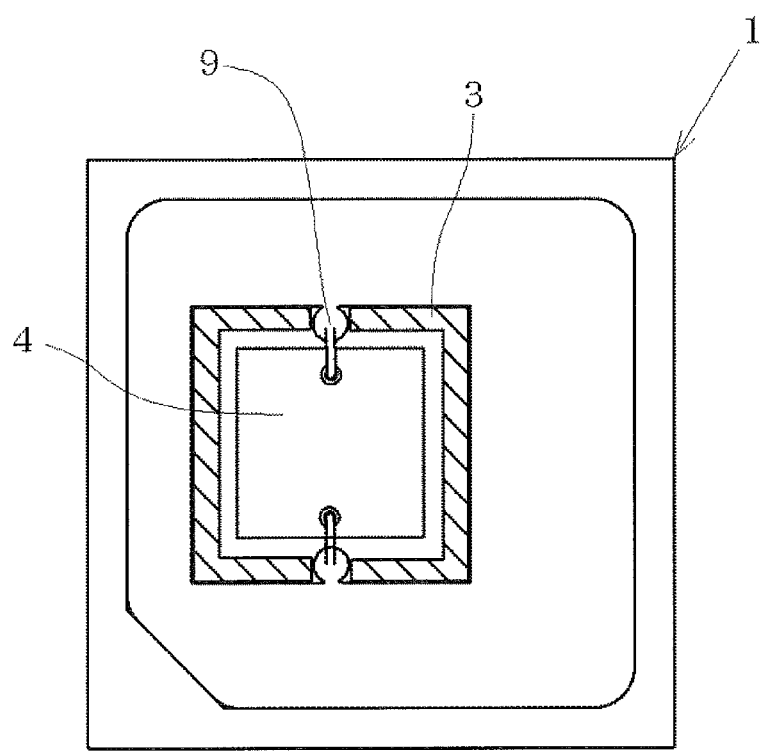
FIG. 7C is a schematic plan view showing Variation of the light emitting device according to the second embodiment.

A description will be given of light emitting devices 200A, 200B according to a second embodiment. FIG. 7A is a schematic plan view of the light emitting device 200A according to the embodiment of the present disclosure. FIG. 7B is an enlarged view of a portion encircled by a broken line in FIG. 7A. FIG. 7C is a schematic plan view showing Variation of the light emitting device 200A. The light emitting device 200A is different from the light emitting device 100 according to the first embodiment in that the light reflecting resin 6 is formed to extend from separating regions of the groove 3 toward the light emitting element 4.

In the light emitting device 200A, the groove 3 is made up of a plurality of straight groove segments, which are disposed to be separated from one another. Specifically, as shown in FIG. 7A, the groove 3 is structured by four straight groove segments disposed to surround the element mounting region X, and separated from one another by four separating regions. As shown in FIG. 7B, part of the light reflecting resin 6 has an extending portions 9 that extend from the separating regions toward the light emitting element 4. Here, the extending portions 9 are formed so as not to abut on the lateral surfaces of the light emitting element 4.

The wires extending from the electrodes of the light emitting element 4 are disposed so as to be covered with the extending portions 9. Thus, the light reflecting resin 6 covers the wires by a greater area, and therefore the rate of light having been output from the light emitting element 4 being absorbed by the wires can be reduced.

The extending portions 9 may be formed by applying the light reflecting resin 6 from the lateral surfaces of the recess 2 and allowing to flow naturally. Alternatively, the extending portions 9 may be formed by forming the light reflecting resin 6 in a plurality of operations. That is, after the light emitting element 4 and the pair of leads 8 are electrically connected to each other by the wires, the extending portions 9 may be formed by potting the light reflecting resin 6 at the separating regions of the groove 3. Thereafter, the light reflecting resin 6 may be formed from the lateral surfaces of the recess 2 to the outer upper edge of the groove 3. In this manner, while the light reflecting resin 6 surely covers the wires that may otherwise absorb light from the light emitting element 4, the light reflecting resin 6 is prevented from largely exceeding the separating regions and abutting on the lateral surfaces of the light emitting element 4. Here, the extending portions 9 are preferably tentatively cured before the light reflecting resin 6 is provided. This prevents deformation of the extending portions, and effectively prevents the light reflecting resin 6 from abutting on the light emitting element 4.

Further, the light reflecting resin structuring the extending portions 9 and the light reflecting resin 6 may be the same material, or may be different materials. Further, the light reflecting resin structuring the extending portions may be resin higher in viscosity than the light reflecting resin 6. This effectively prevents the light reflecting resin 6 from abutting on the light emitting element 4.

In the light emitting device 200B, the groove 3 is structured by a plurality of groove segments disposed to form an angular shape. The groove segments are separated from each other by the separating regions. Here, the separating regions are disposed at the positions except for the corners of the groove 3. Specifically, as shown in FIG. 7C, the groove 3 has an angular shape formed by two groove segments, and the two groove segments are separated from each other by two separating regions. Part of the light reflecting resin 6 has the extending portions 9 that extend from the separating regions toward the light emitting element 4. Here, the extending portions 9 are formed so as not to abut on the lateral surfaces of the light emitting element 4.

The wires extending from the electrodes of the light emitting element 4 are disposed so as to be covered with the extending portions 9. Thus, the light reflecting resin 6 covers the wires by a greater area, and therefore the rate of light having been output from the light emitting element 4 being absorbed by the wires can be reduced. Further, as compared to the light emitting device in which the wires extend in the corner directions of the groove 3, the length of the wires can be shorter with the light emitting device 200B. Accordingly, the rate of light having been output from the light emitting element 4 being absorbed by the wires can further be reduced.

[Light Emitting Device According to Third Embodiment]

Figure 8:
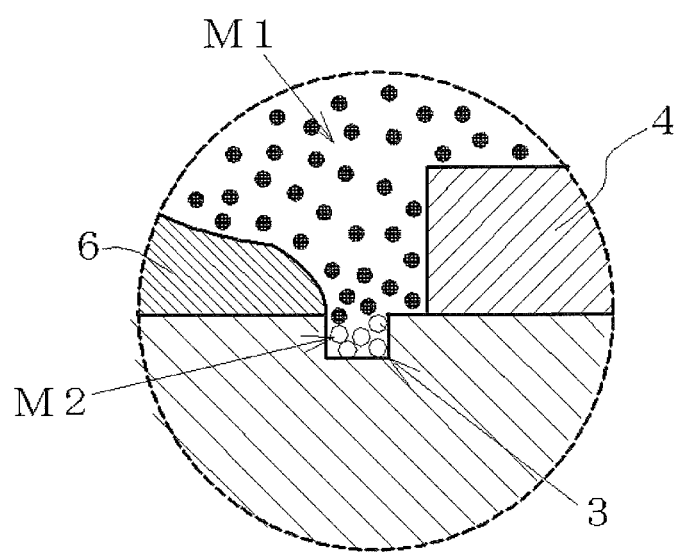
FIG. 8 is a schematic cross-sectional view showing part of a light emitting device according to a third embodiment.

A description will be given of a light emitting device according to a third embodiment. FIG. 8 is a schematic cross-sectional view showing part of the light emitting device according to the third embodiment. The light emitting device according to the third embodiment is different from the light emitting device 100 according to the first embodiment in that the groove 3 is provided with a fluorescent material layer differing in proportion or composition from the fluorescent material layer of the light-transmissive resin 5.

The light emitting device according to the third embodiment includes a first fluorescent material layer M1 of the light-transmissive resin 5 and a second fluorescent material layer M2 being differing in proportion or composition from the first fluorescent material layer M1 and provided in the groove 3. As used herein, "the fluorescent material layer differing in proportion" refers to not only the case where the proportion of the fluorescent material relative to the total weight of the fluorescent material layer is different, but also the case where a plurality of fluorescent materials are used and the proportion of each fluorescent material is different.

By the first fluorescent material layer M1 of the light-transmissive resin 5 and the second fluorescent material layer M2 disposed in the groove 3 differing from each other, the color rendering property, color reproducibility, and light distribution color temperature of the light emitting device can be adjusted.

[Light Emitting Device According to Fourth Embodiment]

Figure 9A:
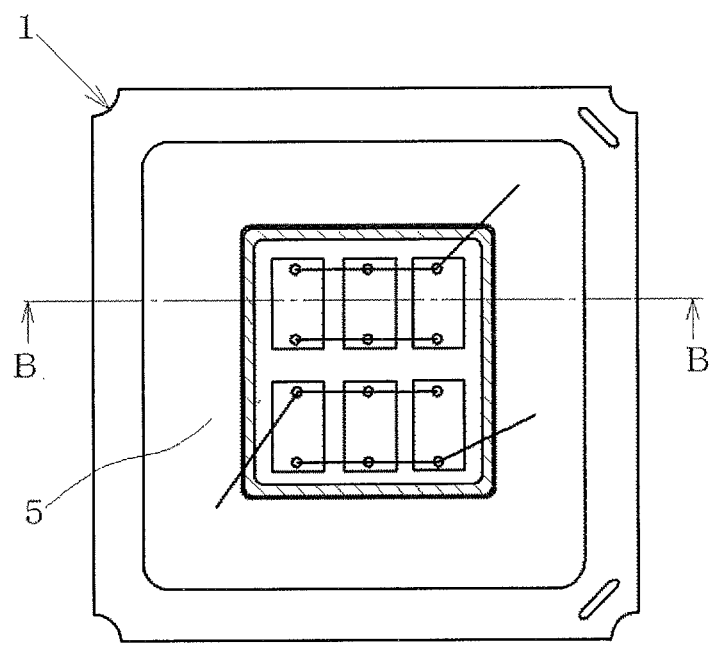
FIG. 9A is a schematic plan view of a light emitting device according to a fourth embodiment.
Figure 9B:
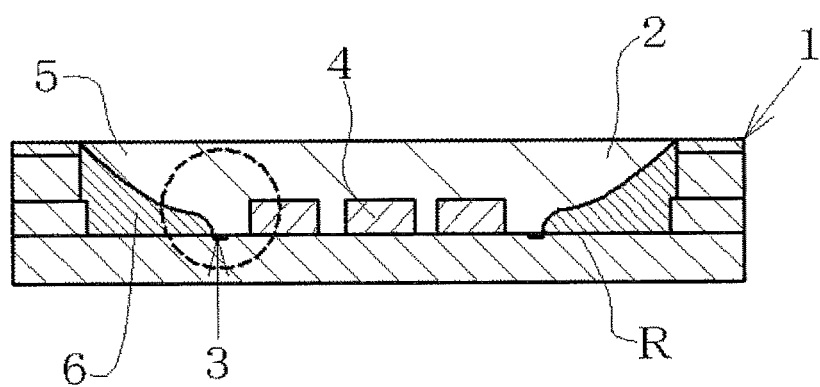
FIG. 9B is a schematic cross-sectional view taken along line B-B in FIG. 9A.
Figure 9C:
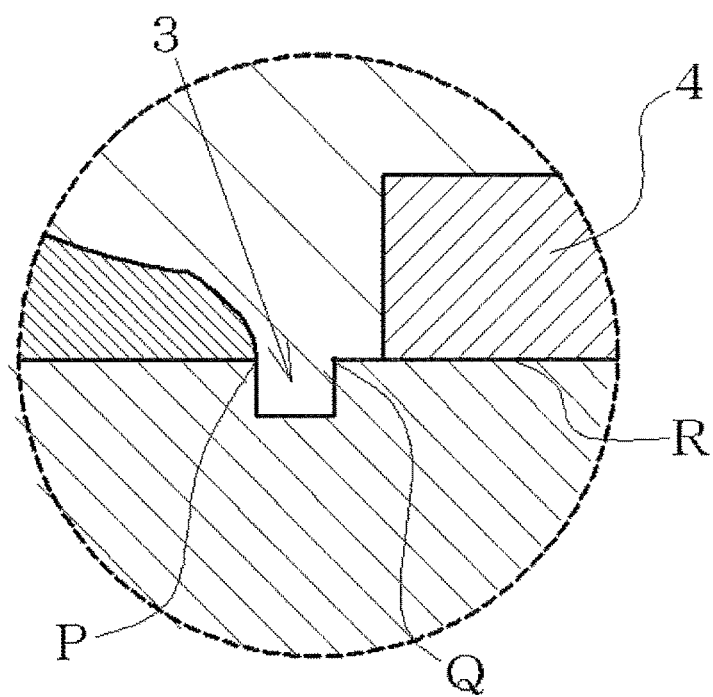
FIG. 9C is an enlarged view of a portion encircled by a broken line in FIG. 9B.

A description will be given of a light emitting device 300 according to a fourth embodiment. FIG. 9A is a schematic plan view showing the light emitting device 300 according to one embodiment of the present disclosure. FIG. 9B is a schematic cross-sectional view taken along line B-B in FIG. 9A. FIG. 9C is an enlarged view of a portion encircled by a broken line in FIG. 9B.

The light emitting device 300 is different in that the groove 3 is formed at an insulating member, from the light emitting device 100 in which the groove 3 is formed at an electrically conductive member (the pair of leads 8).

The package 1 of the light emitting device 300 is structured by a wiring (or an electrode portion) and an insulating member. The wiring supplies power to the electrodes of the light emitting element 4. The insulating member may be a ceramic substrate, a glass epoxy substrate or the like. Further, the insulating member may be the molded body 7 according to the first embodiment. When the molded body 7 is used, the groove 3 is formed at the molded body 7.

As shown in FIG. 9C, the insulating member is disposed at the bottom surface of the recess 2, and the groove 3 is formed at the surface of the insulating member. The wiring (or the electrode portion) is formed at a portion excluding the groove 3. Here, the surface roughness of the insulating member exposed at the inner surface of the groove 3 is preferably greater than that of the plating layer that covers the wiring (or the electrode portion). This improves adhesion force between the groove 3 and the light-transmissive resin 5 or the light reflecting resin 6 being in contact with the inner surface of the groove 3 as compared to the light emitting device in which the plating layer is disposed at the inner surface of the groove 3. Thus, a highly reliable light emitting device can be obtained.

[Light Emitting Device According to Fifth Embodiment]

Figure 10A:
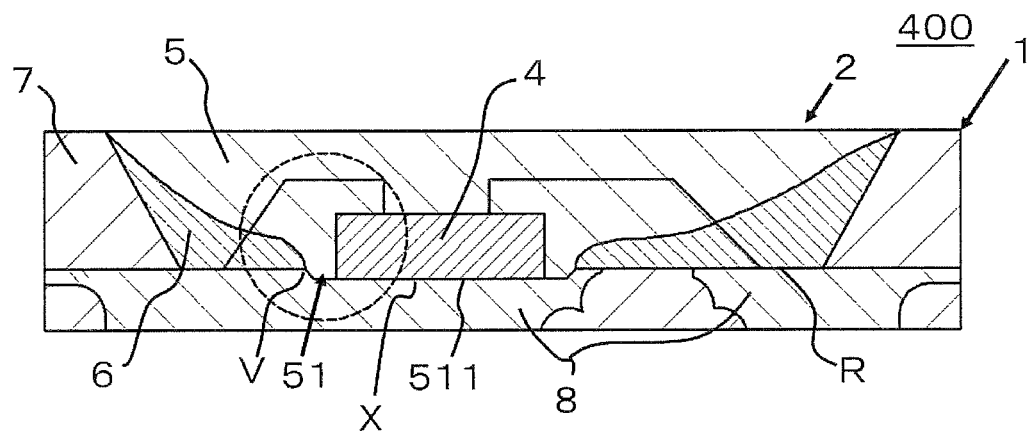
FIG. 10A is a schematic cross-sectional view of a light emitting device according to a fifth embodiment.
Figure 10B:
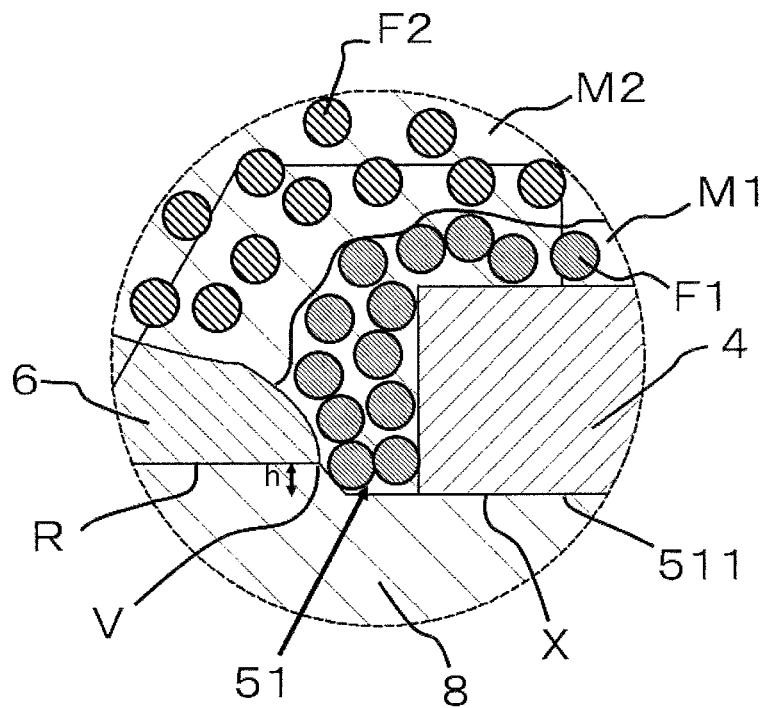
FIG. 10B is an enlarged view of a portion encircled by a broken line in FIG. 10A.

A description will be given of a light emitting device 400 according to a fifth embodiment. FIG. 10A is a schematic cross-sectional view of the light emitting device 400 according to the embodiment of the present disclosure. FIG. 10B is an enlarged view of a portion encircled by a broken line in FIG. 10A. The light emitting device 400 is different from the light emitting device 100 in including a bottom surface recess 51 in place of the groove 3, and in that a light reflecting resin 6 is stopped by the bottom surface recess 51.

The light emitting device 400 includes a package 1 having a recess 2 including lateral surfaces and a bottom surface, and the bottom surface recess 51 provided at the bottom surface so as to be spaced apart from the lateral surfaces and to include an element mounting region X. Further, the light emitting device 400 includes: a light emitting element 4 mounted on the element mounting region X; a light-transmissive resin 5 that covers the light emitting element 4 and is in contact with the lateral surfaces of the bottom surface recess 51; and the light reflecting resin 6 that is formed continuously from the lateral surfaces of the recess 2 to a lateral surface upper edge V of the bottom surface recess 51.

The bottom surface recess 51 is positioned inner than the lateral surfaces of the recess 2, at the bottom surface of the recess 2 of the resin package 1. Further, a bottom surface 511 of the bottom surface recess 51 is positioned lower than a first main surface R of a pair of leads 8. A height h from the first main surface R of the pair of leads 8 to the bottom surface of the bottom surface recess 51 is preferably 10 m to 100 m when the thickness of the pair of leads 8 is 150 μm to 250 μm. Further, the height h relative to the thickness of the pair of leads 8 is preferably 10% to 50%, and more preferably 20% to 30%. Setting the height h in such a range reduces a reduction in strength of the pair of leads 8. Further, it also suppresses the wires electrically connecting between the light emitting element 4 and the pair of leads 8 from reaching the top of the recess 2.

As shown in FIG. 10A, the light reflecting resin 6 is formed continuously to the lateral surface upper edge V of the bottom surface recess 51. The bottom surface recess 51 serves as a stopper that suppresses the light reflecting resin 6 from reaching the lateral surfaces of the light emitting element 4. As shown in FIG. 10B, the lateral surface upper edge V is the edge of the top of the bottom surface recess 51. In other words, the lateral surface upper edge V is the edge where the lateral surfaces of the bottom surface recess 51 and the first main surface R of the pair of leads 8 intersect with each other.

The lateral surfaces of the bottom surface recess 51 are preferably inclined outward from the bottom surface 511 of the bottom surface recess 51 toward the opening of the bottom surface recess 51. Thus, light from the light emitting element 4 disposed at the bottom surface recess 51 can be efficiently reflected toward the opening. Note that, the lateral surfaces of the bottom surface recess 51 may be perpendicular to the bottom surface 511. The bottom surface recess 51 is provided by press processing, etching processing and the like.

As shown in FIG. 10B, in the light emitting device 400, a first fluorescent material layer M1 containing a first fluorescent material F1 may be disposed around the bottom surface recess 51 where the light emitting element 4 is mounted, and a second fluorescent material layer M2 containing a second fluorescent material F2 may be disposed above the first fluorescent material F1. By virtue of the light emitting device 400 having the bottom surface recess 51, the first fluorescent material layer M1 containing the first fluorescent material F1 can be disposed in the bottom surface recess 51 with ease. The first fluorescent material F1 is preferably longer in wavelength than the second fluorescent material F2. This causes excited light emitted from the first fluorescent material F1 to be less absorbed by the second fluorescent material F2, and provides a light emitting device with excellent light extraction efficiency. For example, the first fluorescent material F1 is a red-color fluorescent material, and the second fluorescent material F2 is a yellow-color fluorescent material or a green-color fluorescent material. Note that, while the description has been given of the light emitting device 400 of which package 1 is a resin package having the molded body 7 and the pair of leads 8, the package 1 may be an insulating substrate made of, for example, ceramic.

The embodiment of the present disclosure provides the highly reliable light emitting device in which the light reflecting resin near the light emitting element is suppressed from creeping up. The foregoing description of the embodiments does not limit the structure disclosed in the scope of claims by any means.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a package having a recess which includes a bottom surface and an inner peripheral surface around a periphery of the bottom surface, the bottom surface including a bottom surface recess having a light emitting element mounting region, the bottom surface recess having a lateral surface and an upper edge connected to the lateral surface;
    a light emitting element mounted on the light emitting element mounting region;
    a light-transmissive resin provided in the recess to cover the light emitting element and to be in contact with the lateral surface of the bottom surface recess; and
    a light reflecting resin provided between the inner peripheral surface of the recess and the light-transmissive resin to reach the upper edge of the bottom surface recess.

2. The light emitting device according to claim 1, wherein the package has an electrode which is electrically connected to the light emitting element via a wire, and the light reflecting resin covers a bonding region of the wire.

3. The light emitting device according to claim 1, further comprising:
    a molded body surrounding the recess to define the recess, wherein the light reflecting resin has a reflection rate higher than a reflection rate of the molded body.

4. The light emitting device according to claim 1, further comprising:
    an additional light emitting element, wherein the light emitting element and the additional light emitting element are mounted on the light emitting element mounting region.

5. The light emitting device according to claim 1, wherein an area of the light emitting element mounting region is 1.2 to 2 times greater than a plane area of the at least one light emitting element.

6. The light emitting device according to claim 1, further comprising:
    a molded body surrounding the recess to define the recess;
    a pair of leads that is at least partially exposed from the molded body at the bottom surface of the recess, the pair of leads being directly in contact with the molded body; and
    a protective layer provided between an upper surface of the pair of leads and the light reflecting resin.

7. The light emitting device according to claim 1, further comprising:
    an additional light emitting element, wherein the light emitting element and the additional light emitting element are mounted on the light emitting element mounting region, and
    the light emitting element and the additional light emitting element are mounted staggered in the top-bottom direction or in the right-left direction in a plan view.

8. A light emitting device comprising:
    a package having a recess which includes a bottom surface and an inner peripheral surface around a periphery of the bottom surface, the bottom surface including a light emitting element mounting region and a groove surrounding the light emitting element mounting region, the groove having an inner peripheral edge and an outer peripheral edge on the bottom surface to define the groove between the inner peripheral edge and the outer peripheral edge;
    at least one light emitting element mounted on the light emitting element mounting region;

a light-transmissive resin provided in the recess to cover the at least one light emitting element and to be in contact with the groove; and a light reflecting resin provided between the inner peripheral surface of the recess and the light-transmissive resin to reach the outer peripheral edge of the groove, wherein the package comprises:
- a molded body surrounding the recess to define the recess; and
- a pair of leads that is at least partially exposed from the molded body at the bottom surface of the recess, a plating on a surface of the pair of leads has a thick portion and a thin portion, a thickness of the thick portion being larger than a thickness of the thin portion, and a height difference between the thick portion and the thin portion makes the groove.

9. A light emitting device comprising:

a package having a recess which includes a bottom surface and an inner peripheral surface around a periphery of the bottom surface, the bottom surface including a light emitting element mounting region and a groove surrounding the light emitting element mounting region, the groove having an inner peripheral edge and an outer peripheral edge on the bottom surface to define the groove between the inner peripheral edge and the outer peripheral edge;

at least one light emitting element mounted on the light emitting element mounting region;

a light-transmissive resin provided in the recess to cover the at least one light emitting element and to be in contact with the groove; and a light reflecting resin provided between the inner peripheral surface of the recess and the light-transmissive resin to reach the outer peripheral edge of the groove, wherein the groove comprises groove elements intermittently provided to surround the light emitting element mounting region.

10. The method according to claim 9, wherein the light reflecting resin is applied to a corner or an end of the package recess.

* * * * *